US012796531B2

(12) United States Patent
Lv et al.

(10) Patent No.: US 12,796,531 B2
(45) Date of Patent: Nov. 10, 2026

(54) SEMICONDUCTOR PACKAGE HAVING HIGH METAL BUMPS AND ULTRA-THIN SUBSTRATE AND METHOD OF MAKING THE SAME

(71) Applicant: ALPHA AND OMEGA SEMICONDUCTOR INTERNATIONAL LP, Toronto (CA)

(72) Inventors: Lin Lv, Shanghai (CN); Zhen Yang, Kunshan (CN); Shuhua Zhou, Shanghai (CN); Long-Ching Wang, Cupertino, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 306 days.

(21) Appl. No.: 18/783,446

(22) Filed: Jul. 25, 2024

(65) Prior Publication Data

US 2025/0070069 A1 Feb. 27, 2025

Related U.S. Application Data

(63) Continuation-in-part of application No. 18/236,856, filed on Aug. 22, 2023, now Pat. No. 12,568,845.

(51) Int. Cl.

| | |
|---|---|
| ***H10W 74/10*** | (2026.01) |
| ***H10P 52/00*** | (2026.01) |
| ***H10W 72/20*** | (2026.01) |
| ***H10W 72/90*** | (2026.01) |

(52) U.S. Cl.

CPC ........... *H10W 74/141* (2026.01); *H10P 52/00* (2026.01); *H10W 72/221* (2026.01); *H10W 72/234* (2026.01); *H10W 72/252* (2026.01); *H10W 72/923* (2026.01); *H10W 72/952* (2026.01)

(58) Field of Classification Search

CPC .... H10W 74/141; H10W 72/221; H10P 52/00

See application file for complete search history.

(56) References Cited

U.S. PATENT DOCUMENTS

| | | | |
|---|---|---|---|
| 2021/0202436 A1* | 7/2021 | Yeh | H10P 34/42 |
| 2023/0307251 A1* | 9/2023 | Liu | H10W 70/09 |

* cited by examiner

*Primary Examiner* — Steven M Page

(74) *Attorney, Agent, or Firm* — Chen-Chi Lin

(57) ABSTRACT

A semiconductor package comprises a semiconductor substrate, a plurality of contact pads, a plurality of metal bumps, a metal layer, and a molding encapsulation. A thickness of the semiconductor substrate is less than 35 microns. A first method comprises the steps of providing a device wafer; attaching a first carrier; applying a thinning process; forming a metal layer; applying a first tape; removing the first carrier; applying a first singulation process; removing the first tape; attaching a second carrier; forming a molding encapsulation; removing the second carrier; forming a plurality of metal bumps; applying a second tape; and applying a singulation process and removing the second tape. A second method comprises the steps of providing a device wafer; attaching a carrier; applying a thinning process; forming a metal layer; forming a molding encapsulation; removing the carrier; forming a plurality of metal bumps; and applying a singulation process.

13 Claims, 14 Drawing Sheets

SEMICONDUCTOR PACKAGE HAVING HIGH METAL BUMPS AND ULTRA-THIN SUBSTRATE AND METHOD OF MAKING THE SAME

CROSS-REFERENCE TO RELATED APPLICATIONS

This Patent Applications is a Continuation-in-part Applications of a pending application Ser. No. 18/236,856 filed on Aug. 22, 2023. The entire Disclosure made in the pending application Ser. No. 18/236,856 is hereby incorporated by reference.

FIELD OF THE INVENTION

This invention relates generally to a semiconductor package having a thin semiconductor substrate of less than 35 microns and methods of making a plurality of semiconductor packages. More particularly, the present invention relates to a semiconductor package having high metal bumps.

BACKGROUND OF THE INVENTION

Chip scaled package (CSP) dies are generally required to be connected to printed circuit boards (PCBs) by using a flip-chip process including a capillary underfill (CUF) assembly process and a molded underfill (MUF) assembly process. The MUF assembly process is more popular because of its high productivity, lower cost, and high reliability advantages. A gap (a height of a metal bump or a solder bump) between a die and a PCB is preferred to be at least 40 microns so as to facilitate improving compound filling. The high metal bump or high solder bump (at least 40 microns) usually requires thicker semiconductor substrate (larger than 50 microns) so as to avoid generating wafer cracks during back-side grinding of the semiconductor substrate.

Advantages of instant disclosure include suppressed solder bridge issue, improved structure strength, low warpage (less than 10 microns at 25 degrees Centigrade and less than 40 microns at 245 degrees Centigrade), and higher yield of semiconductor packages.

SUMMARY OF THE INVENTION

A semiconductor package comprises a semiconductor substrate, a plurality of contact pads on a front side of the semiconductor substrate, a plurality of metal bumps at least 35 microns height on top of the contact pads, a metal layer on a back surface of the semiconductor substrate, and a molding encapsulation overlaying the semiconductor. A thickness of the semiconductor substrate is in a range from 15 microns to 35 microns. A thickness of the metal layer may be up to 30 microns or more.

Methods for fabricating a plurality of semiconductor packages are disclosed. A method applicable to any back metal thickness, especially for thick back metal 10 um or more, comprises the steps of providing a device wafer; attaching a first carrier; applying a thinning process; forming a metal layer; applying a first tape; removing the first carrier; applying a first singulation process; transferring singulated chips to a second carrier; forming a molding encapsulation; removing the second carrier; forming a plurality of metal bumps; applying a second tape; and applying a singulation process and removing the second tape. The second method comprises the steps of providing a device wafer; attaching a carrier; applying a thinning process; forming a metal layer; forming a molding encapsulation; removing the carrier; forming a plurality of metal bumps; and applying a singulation process.

DETAILED DESCRIPTION OF THE INVENTION

Figure 1A:
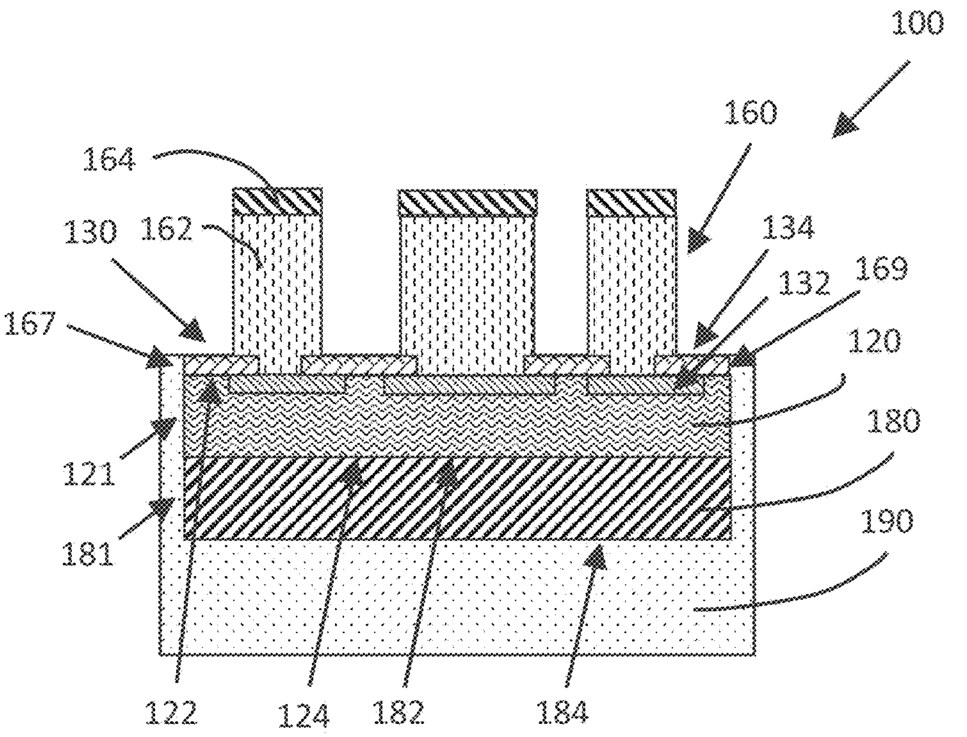
FIGS. 1A and 1B show cross-sectional views of semiconductor packages in examples of the present disclosure.

FIG. 1A shows a cross-sectional view of a semiconductor package 100 in examples of the present disclosure. The semiconductor package 100 comprises a semiconductor substrate 120, a plurality of contact pads 130, a plurality of metal bumps 160, a metal layer 180, and a molding encapsulation 190. In examples of the present disclosure, the coefficient of thermal expansion (CTE) of the molding encapsulation 190 is less than 7 ppm/° C. and a glass transition temperature (Tg) of the molding encapsulation 190 is larger than 150 degrees Centigrade.

The semiconductor substrate 120 has a plurality of side surfaces 121, a front surface 122 and a back surface 124 opposite the front surface 122 of the semiconductor substrate 120. The plurality of contact pads 130 comprises a plurality of aluminum sections 132 exposed through openings between a plurality of passivation sections 134. The plurality of aluminum sections 132 are disposed at the front surface 122 of the semiconductor substrate 120. The plurality of passivation sections 134 extend above the plurality of aluminum sections 132. The plurality of metal bumps 160 are attached to top surfaces of the plurality of aluminum sections 132.

The metal layer 180 has a plurality of side surfaces 181, a front surface 182, and a back surface 184 opposite the front surface 182 of the metal layer 180. The front surface 182 of the metal layer 180 is directly attached to the back surface 124 of the semiconductor substrate 120. The plurality of side surfaces 181 define edges of the metal layer 180. The molding encapsulation 190 directly contacts the plurality of side surfaces 121 of the semiconductor substrate 120, and the plurality of side surfaces 181 and the back surface 184 of the metal layer 180. Silver debris of the metal layer 180 is encapsulated by the molding encapsulation 190 so as to suppress silver migration that may lead to reliability failure. The molding encapsulation 190 further directly contacts a side surface 167 of a first selected one of the plurality of passivation sections 134 and a side surface 169 of a second selected one of the plurality of passivation sections 134.

In examples of the present disclosure, a thickness of the semiconductor substrate 120 is less than 35 microns, preferable in a range from 15 microns to 35 microns. A thickness of the metal layer 180 is up to 30 microns.

In one example, the metal layer 180 is titanium-copper layer (TiCu) having a thickness in a range from 1 micron to 30 microns. In another example, the metal layer 180 is titanium-nickel-silver (TiNiAg) having a thickness in a range from 1 micron to 30 microns.

In examples of the present disclosure, each of the plurality of metal bumps 160 is of a column shape with a height of 35 um or more. Each of the plurality of metal bumps 160 comprises a respective copper portion 162, and a respective tin-silver portion 164 above the respective copper portion 162. In examples of the present disclosure, a height of the respective copper portion 162 is in a range from 20 microns to 100 microns. A height of the respective tin-silver portion 164 is in a range from 15 microns to 30 microns.

In examples of the present disclosure, bottom surfaces of the plurality of metal bumps 160 and top surfaces of the plurality of aluminum sections 132 are co-planar. Bottom surfaces of the plurality of metal bumps 160 and bottom surfaces of the plurality of passivation sections 134 are co-planar.

In examples of the present disclosure, the semiconductor package 100 is a common-drain metal-oxide-semiconductor field-effect transistor (MOSFET) chip scale package (CSP) for battery protection application. Two gates and a plurality of sources are on a front surface of the common-drain MOSFET CSP. A common-drain is on a back surface of the common-drain MOSFET CSP.

Figure 1B:
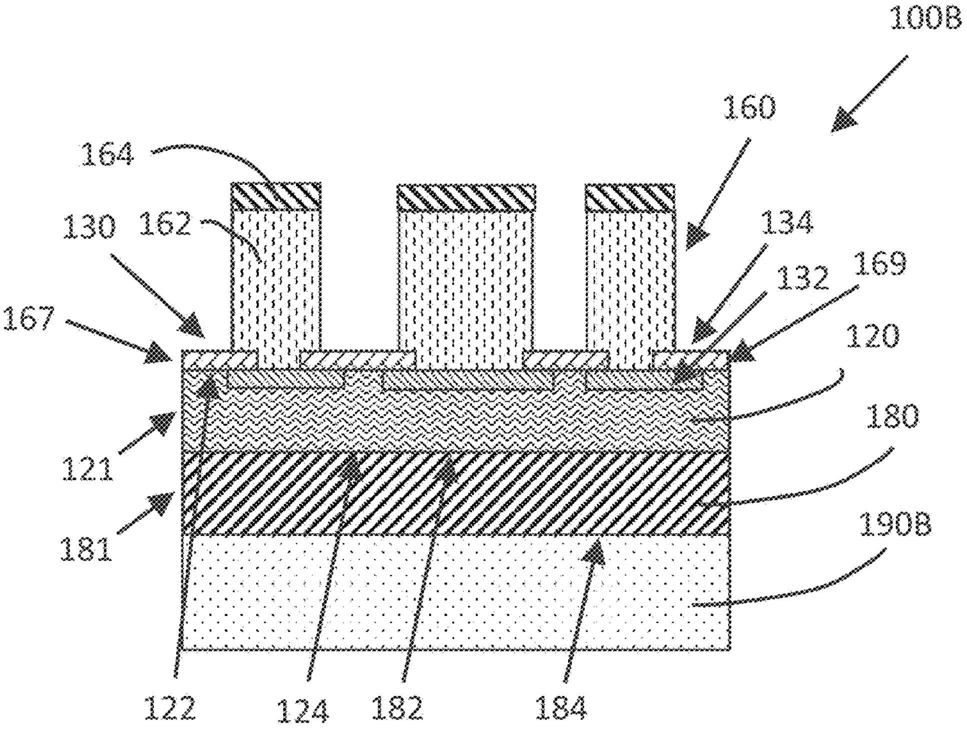

FIG. 1B shows a cross-sectional view of an alternative semiconductor package 100B in examples of the present disclosure. The semiconductor package 100B is the same as the semiconductor package 100 of FIG. 1A, except that molding encapsulation 190B only covers back surface 184 of the metal layer 180. The plurality of side surfaces 121 of the semiconductor substrate 120, and the plurality of side surfaces 181 of the metal layer 180 are exposed.

Figure 2:
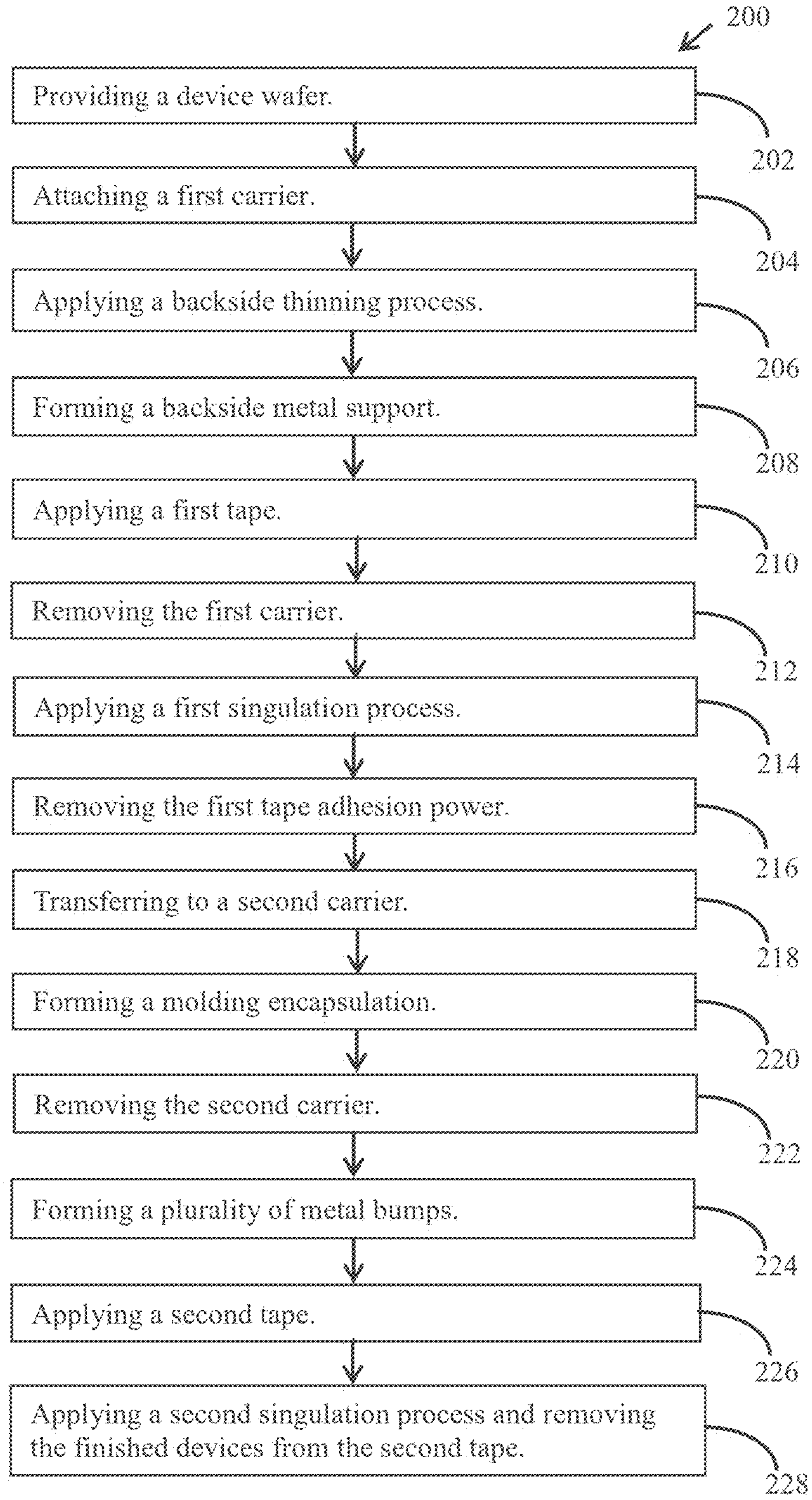
FIG. 2 is a flowchart of a process to develop a plurality of semiconductor packages in examples of the present disclosure.
Figure 4:
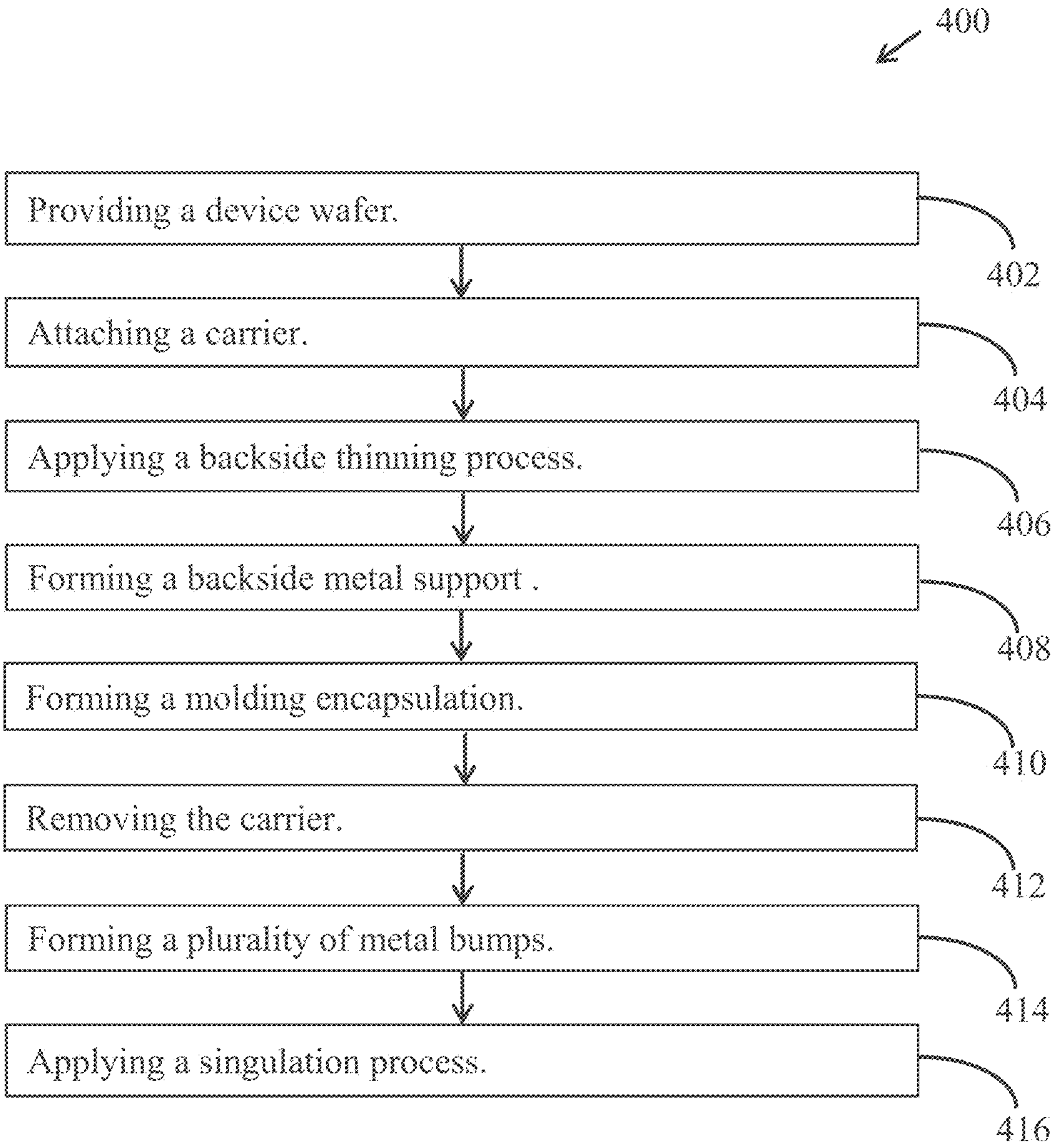
FIG. 4 is a flowchart of a process to develop a plurality of semiconductor packages in examples of the present disclosure.

In examples of the present disclosure, the flowchart of a process 200 of FIG. 2 is for a semiconductor package 100 of FIG. 1A preferably having a thickness of a metal layer 380 being at least 10 microns. The flowchart of the process 200 of FIG. 2 includes a first singulation process (block 214) and a second singulation process (block 228) so as to release stress developed in a semiconductor wafer before forming a molding encapsulation 390 thereby reducing mismatch of the CTE of the molding encapsulation 390 and the CTE of the metal layer 380. In examples of the present disclosure, the flowchart of a process 400 of FIG. 4 is for a semiconductor package 100B of FIG. 1B preferably having a thickness of a metal layer 580 being less than 10 microns.

FIG. 2 is a flowchart of a process 200 to develop a plurality of semiconductor packages in examples of the present disclosure. FIGS. 3A, 3B, 3C, 3D, 3E, 3F, 3G, 3H, 3I, 3J, 3K, 3L, 3M, and 3N show the cross sections of the corresponding steps of the process 200 of FIG. 2 in examples of the present disclosure. For simplicity, each of FIGS. 3A, 3B, 3C, 3D, 3E, 3F, 3H, 3I, 3J, 3K, 3L, and 3M only show fabrication process of one semiconductor package. For simplicity, each of FIGS. 3G and 3N only show fabrication process of two semiconductor packages being singulated. The number of semiconductor packages fabricated from one wafer may vary. The process 200 may start from block 202.

Figure 3A:
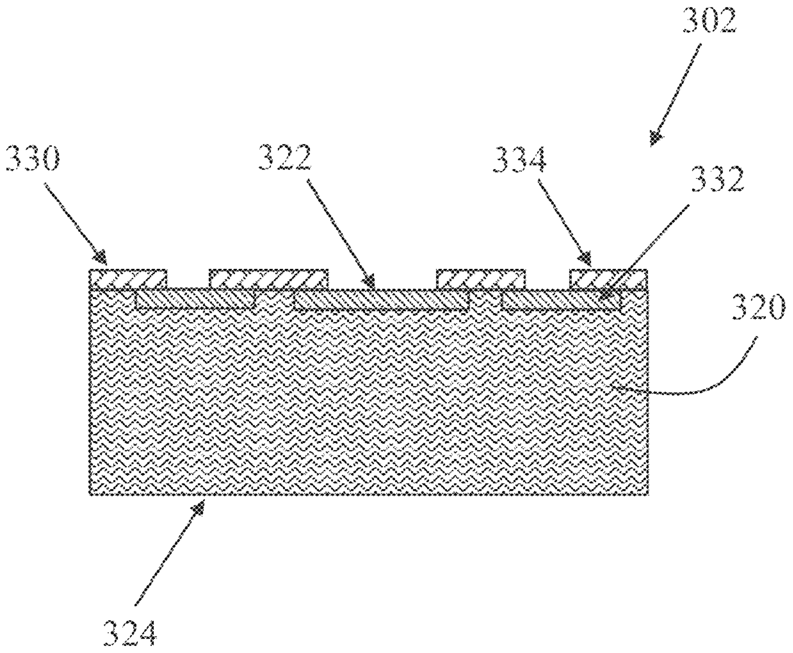
FIGS. 3A, 3B, 3C, 3D, 3E, 3F, 3G, 3H, 3I, 3J, 3K, 3L, 3M, and 3N show the cross sections of the corresponding steps of the process of FIG. 2 in examples of the present disclosure.

In block 202, referring now to FIG. 3A, a device wafer 302 is provided. The device wafer 302 comprises a semiconductor substrate 320 having a plurality of semiconductor devices formed thereon. Each semiconductor devices may have one or more contact pads 330 for providing connections to the electrodes of the semiconductor devices. A plurality of contact pads 330, on the device wafer 302, comprise a plurality of aluminum sections 332 exposed from a plurality of openings of a passivation layer 334. The plurality of aluminum sections 332 are disposed at the front surface 322 of the semiconductor substrate 320. The passivation layer 334 is less than 10 um thickness and is disposed above the plurality of aluminum sections 332 and then patterned to exposed central areas of the plurality of aluminum sections 332. The semiconductor substrate 320 has a front surface 322 and a back surface 324 opposite the front surface 322 of the semiconductor substrate 320. The plurality of contact pads 330 are attached to the front surface 322 of the semiconductor substrate 320. Block 202 may be followed by block 204.

Figure 3B:
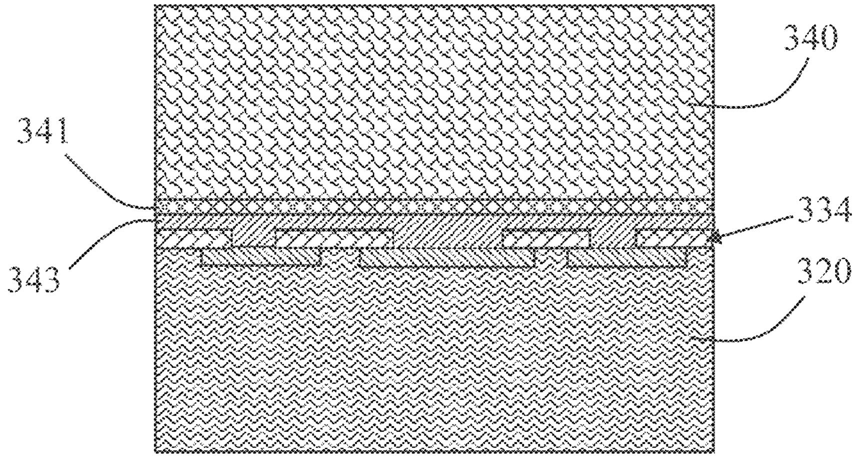

In block 204, referring now to FIG. 3B, a first carrier 340 is attached to the front of the device wafer 302 by a release layer 341 and an adhesive layer 343. In examples of the present disclosure, the adhesive layer 343 is transparent. The adhesive layer 343 surrounds and protects the plurality of contact pads 330. In one example, the first carrier 340 is composed of a metal material. In another example, the first carrier 340 is composed of a glass material. The bonding of the first carrier 340 will increase the strength of the device wafer 302 so as to reduce warpage during subsequent processing steps. In examples of the present disclosure, block 204 is a bonding process including a heat cured process or an ultra-violet (UV) cured process in a bonding machine. Because no large trench and no bumps formed on the device wafer front surface yet, the device wafer front surface is relatively smooth with less than 10 um thickness of passivation layer on top of the aluminum sections 332, total thickness variation (TTV) of bonding can be controlled under 3 microns. Block 204 may be followed by block 206.

Figure 3C:
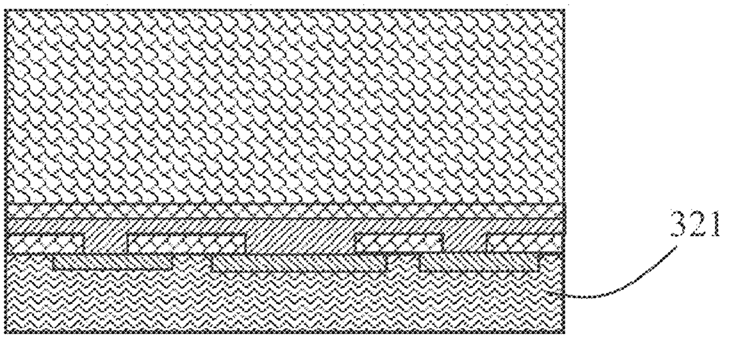

In block 206, referring now to FIG. 3C, a thinning process is applied over the back surface 324 of the semiconductor substrate 320 so as to formed a thinned semiconductor substrate 321. In examples of the present disclosure, a thickness of the thinned semiconductor substrate 321 is in a range from 15 microns to 35 microns. Good total thickness variation TTV≤3 um can be achieved due to good bonding TTV. The thinning process may include back side grinding and back side etching. Block 206 may be followed by block 208.

Figure 3D:
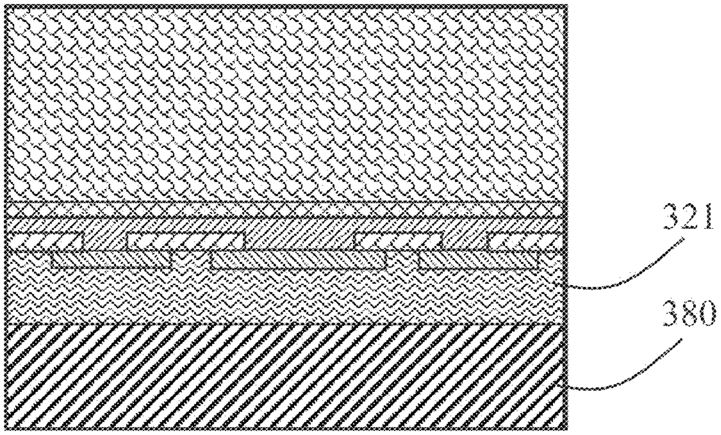

In block 208, referring now to FIG. 3D, a metal layer 380 is formed on a back surface of the thinned semiconductor substrate 321. In examples of the present disclosure, a thickness of the metal layer 380 may be up to 30 microns or more. In one example, the metal layer 380 contain copper formed by electrochemical plating. In another example, the metal layer 380 contain silver or solder formed by electrochemical plating. In examples of the present, a cross section of the metal layer 380 is of a rectangular shape. In one example, the metal layer 380 is titanium-copper layer (TiCu) having a thickness in a range from 1 micron to 30 microns. In another example, the metal layer 380 is titanium-nickel-silver (TiNiAg) having a thickness in a range from 1 micron to 30 microns. Block 208 may be followed by block 210.

Figure 3E:
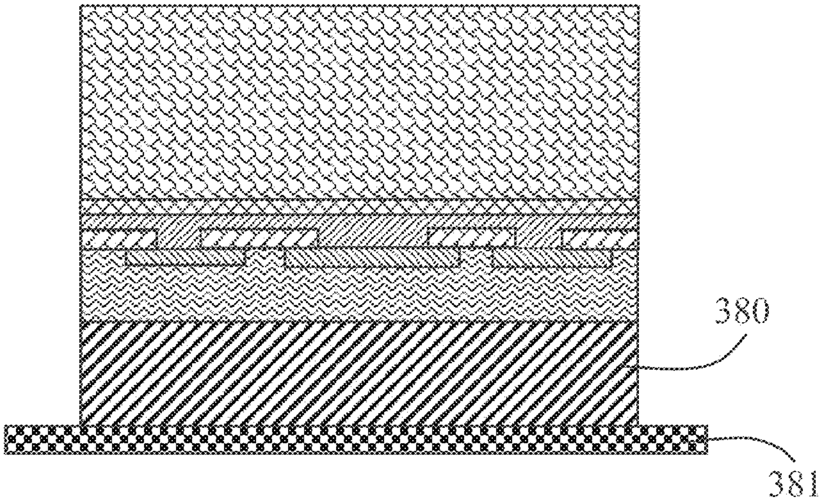

In block 210, referring now to FIG. 3E, a first tape 381 is attached to a back surface of the metal layer 380. In examples of the present disclosure, the first tape 381 is a double-sided tape being heat cured or UV cured. Block 210 may be followed by block 212.

Figure 3F:
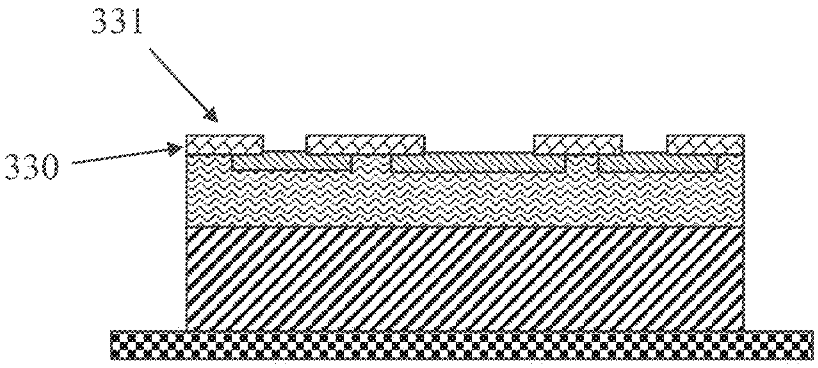

In block 212, referring now to FIG. 3F, the first carrier 340 is removed so that top surfaces 331 of the plurality of contact pads 330 are exposed. In examples of the present disclosure, block 212 is a de-bonding process by applying a laser irradiation process. Block 212 may be followed by block 214.

Figure 3G:
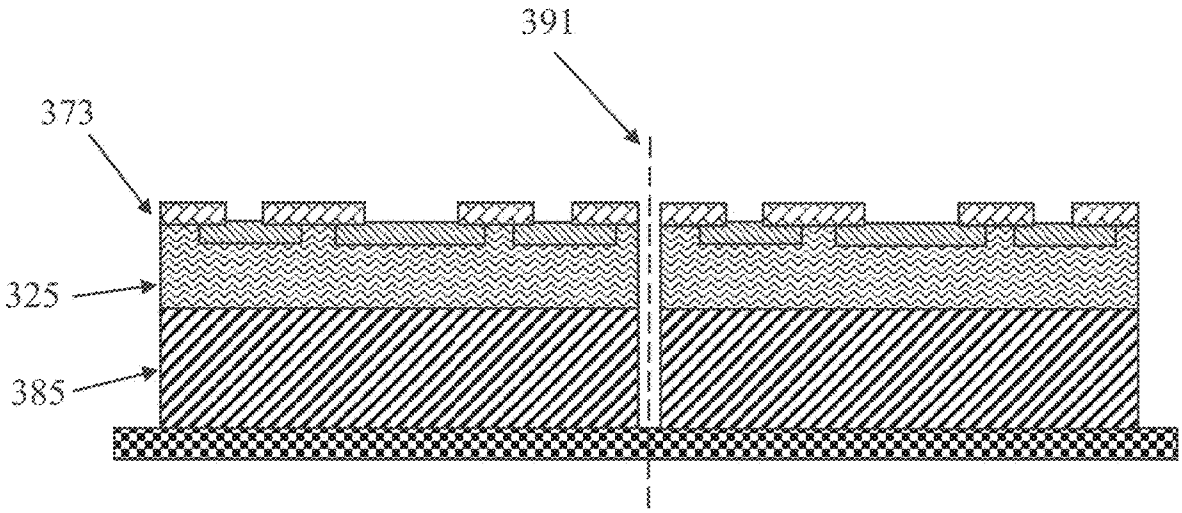

In block 214, referring now to FIG. 3G, a first singulation process 391 is applied so as to form a plurality of interim devices 373 comprising a plurality of singulated semiconductor substrates 325 and a plurality of singulated metal layers 385. Block 214 may be followed by block 216.

Figure 3H:
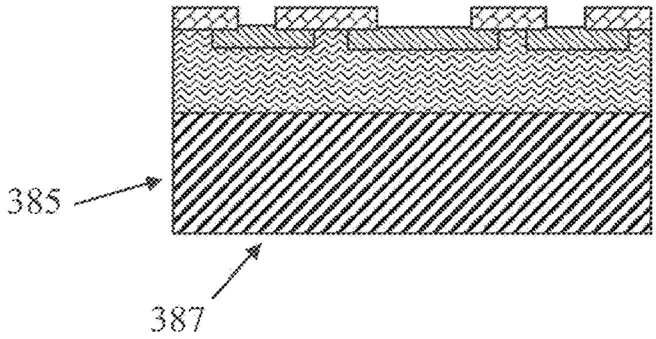

In block 216, referring now to FIG. 3H, the adhesion power of the first tape 381 is removed so that bottom surfaces 387 of the plurality of singulated metal layers 385 can be separated from the first tape 381. In examples of the present disclosure, the adhesion of the first tape 381 is lost at high temperature (larger than 150 degrees Centigrade). Block 216 may be followed by block 218.

Figure 3I:
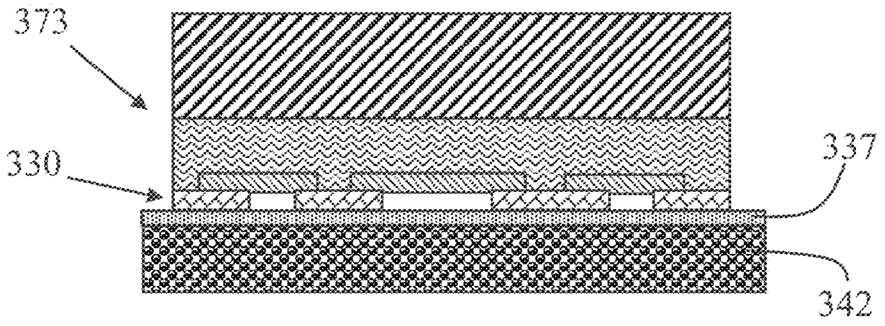

In block 218, referring now to FIG. 3I, the plurality of interim devices 373 are flipped and transferred to a second carrier 342 so that the plurality of contact pads 330 are bottomed down and attached to a double-sided adhesive layer 337 attached to the second carrier 342. The plurality of interim devices 373 are flipped attached to the double-sided adhesive layer 337 with a predefined space therebetween. In examples of the present disclosure, the second carrier 342 is made of a glass material. Block 218 may be followed by block 220.

Figure 3J:
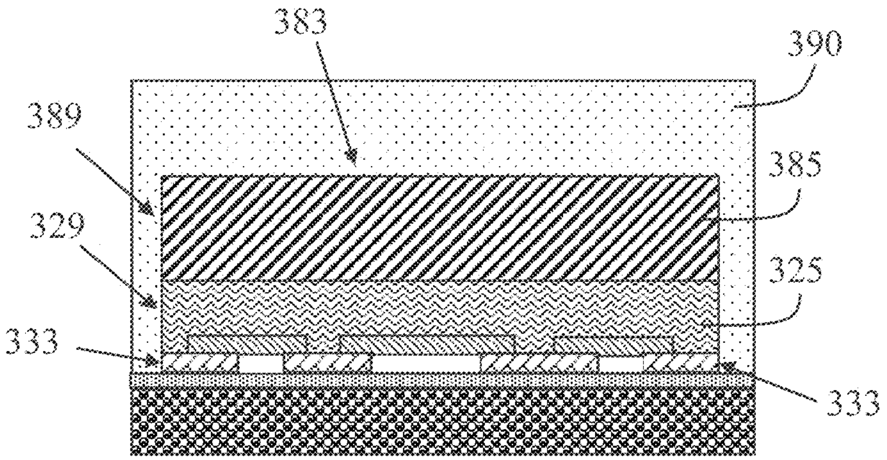

In block 220, referring now to FIG. 3J, a molding encapsulation 390 is filling the predefined spaces between adjacent interim devices 373 and covering the back surfaces of the plurality of interim devices 373 with a predefined thickness bonds the plurality of interim devices 373 together as a molded wafer. The molding encapsulation 390 directly contacts side surfaces 329 of the plurality of singulated semiconductor substrates 325, and the side surfaces 389 of the plurality of singulated metal layers 385 and back surfaces 383 of the plurality of singulated metal layers 385. The molding encapsulation 390 prevents the back surfaces 383 of the plurality of singulated metal layers 385 from oxidation. Silver debris during the first singulation process are encapsulated by the molding encapsulation 390 so as to suppress silver migration that may cause reliability failure. The molding encapsulation 390 further directly contacts a side surface 333 of the passivation layer 334 at all edges of each plurality of interim devices 373. In examples of the present disclosure, the CTE of the molding encapsulation 390 is less than 7 ppm/° C. and a Tg of the molding encapsulation 190 is larger than 150 degrees Centigrade. Block 220 may be followed by block 222.

Figure 3K:
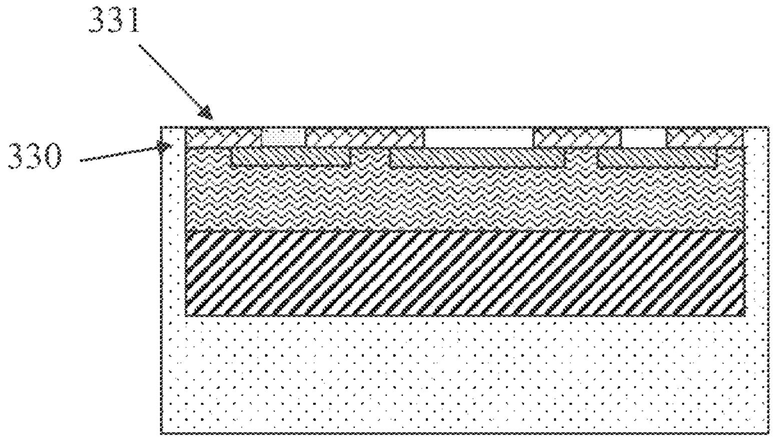

In block 222, referring now to FIG. 3K, the second carrier 342 is removed. Openings of the passivation layer 334 are not filled with the molding encapsulation 390 so the aluminum sections of the contact pads are exposed. The second carrier 342 may be removed by a de-bonding process. The molded wafer is then flipped again so that the plurality of contact pads 330 are on top, top surfaces 331 of the plurality of contact pads 330 are exposed. Block 222 may be followed by block 224.

Figure 3L:
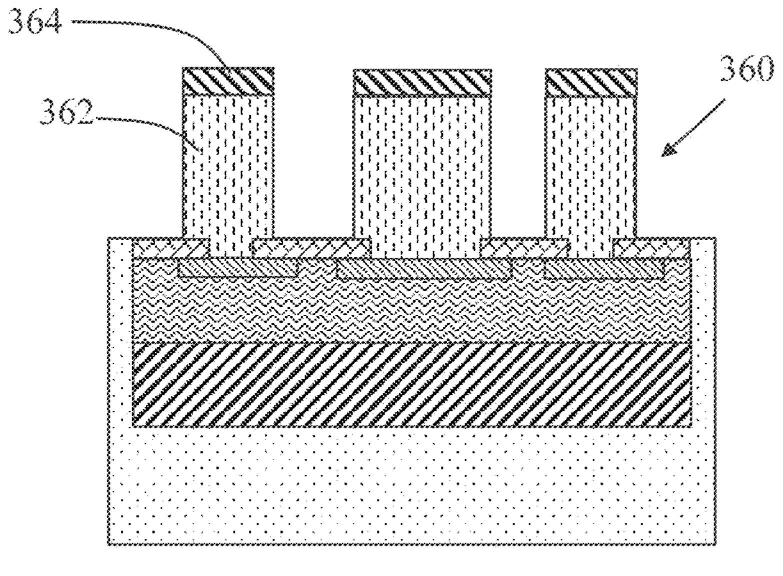

In block 224, referring now to FIG. 3L, a plurality of metal bumps 360 are formed. In examples of the present disclosure, each of the plurality of metal bumps 360 is of a column shape. In examples of the present disclosure, each of the plurality of metal bumps 360 comprises a respective copper portion 362 between 20 um to 100 um in height, and a respective tin-silver portion 364 between 15 um to 30 um in height above the respective copper portion 362. Bottom surfaces of the plurality of metal bumps 360 and top surfaces of the plurality of aluminum sections 332 are co-planar. Bottom surfaces of the plurality of metal bumps 360 and bottom surfaces of the plurality of passivation sections 344 are co-planar. Block 224 may be followed by block 226.

Figure 3M:
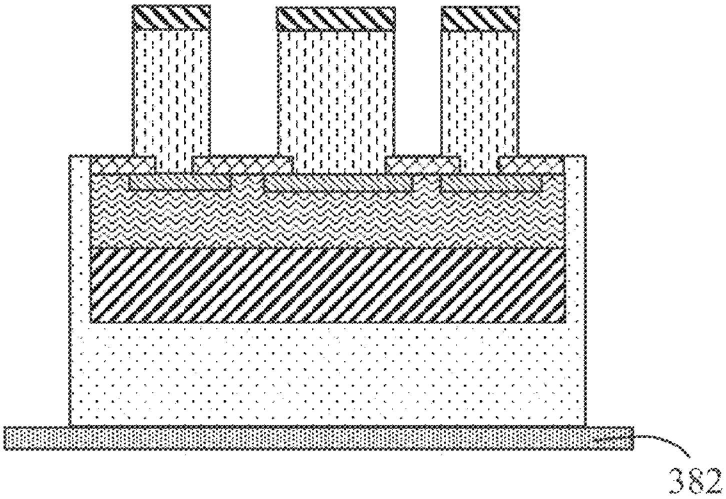

In block 226, referring now to FIG. 3M, a second tape 382 is attached. Block 226 may be followed by block 228.

Figure 3N:
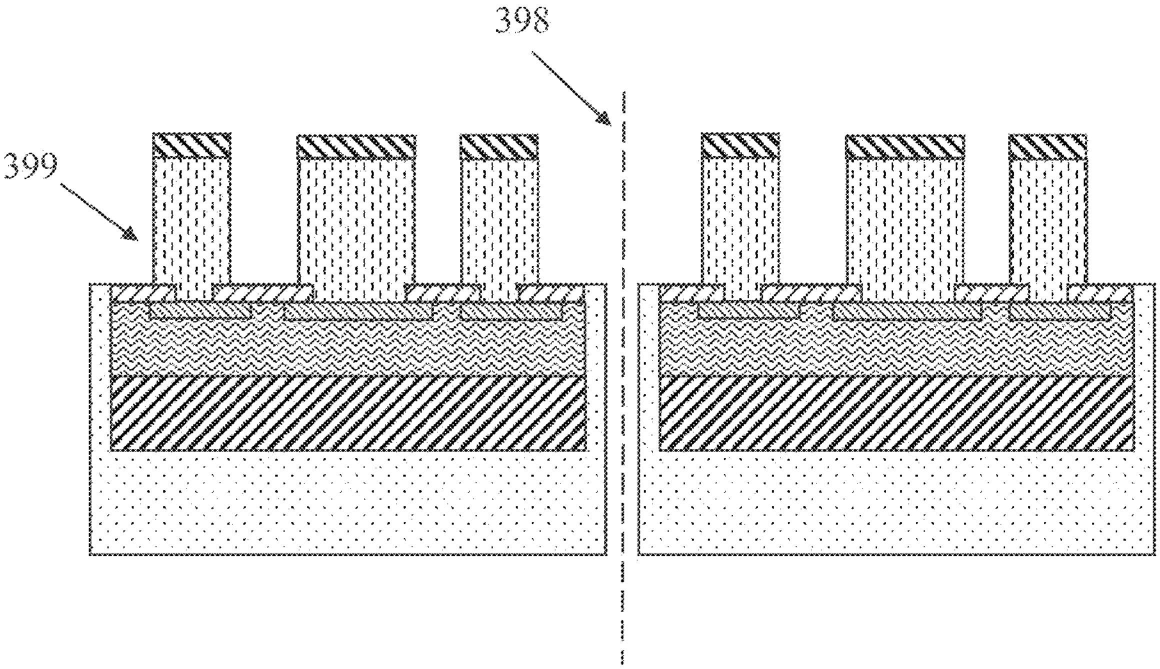

In block 228, referring now to FIG. 3N, a second singulation process 398 is applied and the second tape 382 is removed so as to form the plurality of semiconductor packages 399. Though two semiconductor packages are shown in the cross-sectional view of FIG. 3N, the number of semiconductor packages may vary. In one example, the singulation process is a laser cutting process. In another example, the singulation process is a saw blade cutting process.

In examples of the present disclosure, each of the plurality of semiconductor packages 399 is a common-drain metal-oxide-semiconductor field-effect transistor (MOSFET) chip scale package (CSP) for battery protection application. In examples of the present disclosure, two gates and a plurality of sources are on a front surface of the common-drain MOSFET CSP. A common-drain is on a back surface of the common-drain MOSFET CSP.

FIG. 4 is a flowchart of a process 400 to develop a plurality of semiconductor packages (for example, the semiconductor package 100B in FIG. 1B) of the present disclosure. FIGS. 5A, 5B, 5C, 5D, 5E, 5F, 5G, and 5H show the cross sections of the corresponding steps of the process 400 of FIG. 4 in examples of the present disclosure. For simplicity, each of 5A, 5B, 5C, 5D, 5E, 5F, and 5G only show fabrication process of one semiconductor package. For simplicity, each of FIG. 5H only show fabrication process of two semiconductor packages being singulated. The number of semiconductor packages fabricated from one wafer may vary. The process 400 may start from block 402.

Figure 5A:
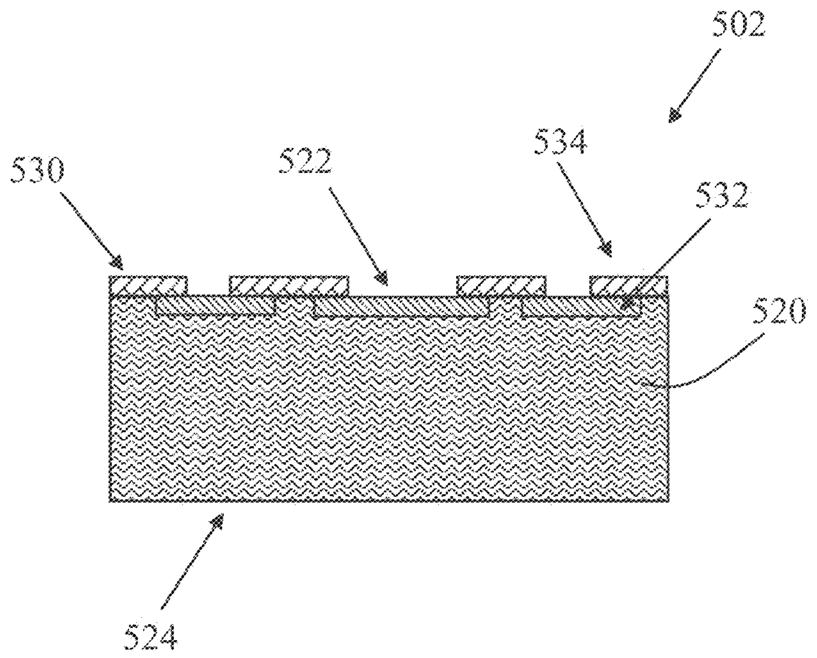
FIGS. 5A, 5B, 5C, 5D, 5E, 5F, 5G, and 5H show the cross sections of the corresponding steps of the process of FIG. 4 in examples of the present disclosure.

In block 402, referring now to FIG. 5A, a device wafer 502 is provided. The device wafer 502 comprises a semiconductor substrate 520 having a plurality of semiconductor devices formed thereon. Each semiconductor devices may have a one or more contact pads 530 for providing connections to the electrodes of the semiconductor devices. A plurality of contact pads 530 on the device wafer 502 comprises a plurality of aluminum sections 532 exposed from a plurality of openings of a passivation layer 534. The plurality of aluminum sections 532 are disposed at the front surface 522 of the semiconductor substrate 520. The passivation layer 534 is less than 10 um thickness and is disposed above the plurality of aluminum sections 532 and then patterned to exposed central areas of the plurality of aluminum sections 532. The semiconductor substrate 520 has a front surface 522 and a back surface 524 opposite the front surface 522 of the semiconductor substrate 520. The plurality of contact pads 530 are attached to the front surface 522 of the semiconductor substrate 520. Block 402 may be followed by block 404.

Figure 5B:
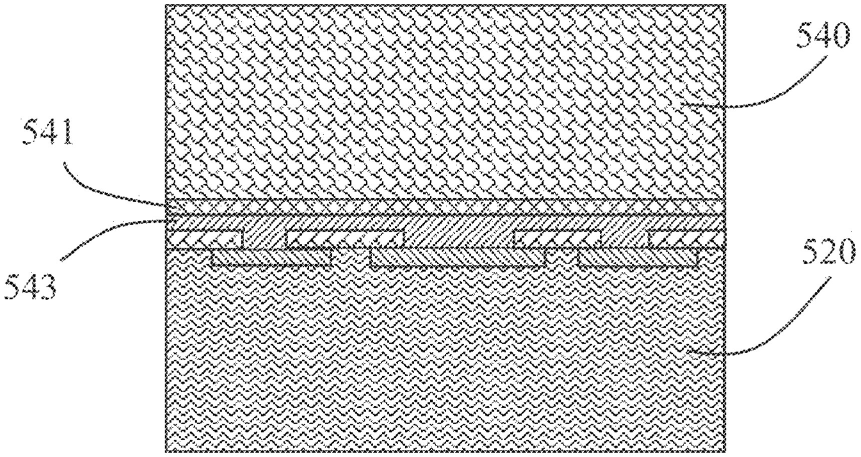

In block 404, referring now to FIG. 5B, a carrier 540 is attached to the plurality of contact pads 530 of the device wafer 502 by a release layer 541 and an adhesive layer 543. In examples of the present disclosure, the adhesive layer 543 is transparent. The adhesive layer 543 surrounds and protects the plurality of contact pads 530. In one example, the carrier 540 is composed of a metal material. In another example, the carrier 540 is composed of a glass material. The attachment of the carrier 540 will increase the strength of the device wafer 502 so as to reduce warpage during subsequent processing steps. In examples of the present disclosure, block 404 is a bonding process including a heat cured process or a UV cured process in a bonding machine. Because no large trench and no bumps formed on the device wafer front surface yet, the device wafer front surface is relatively smooth with less than 10 um thickness of passivation layer on top of the aluminum sections 332, total thickness variation (TTV) of bonding can be controlled under 3 microns. Block 404 may be followed by block 406.

Figure 5C:
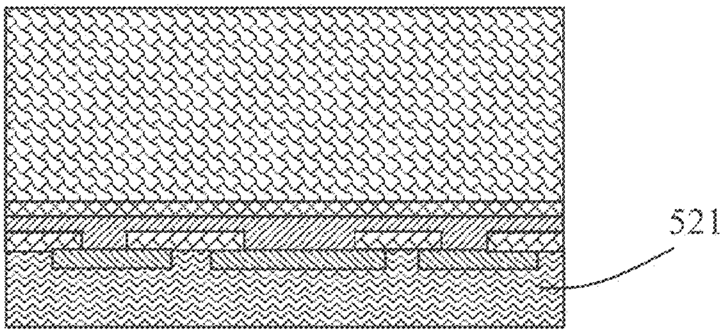

In block 406, referring now to FIG. 5C, a thinning process is applied over the back surface 524 of the semiconductor substrate 520 so as to formed a thinned semiconductor substrate 521. In examples of the present disclosure, a thickness of the thinned semiconductor substrate 521 is in a range from 15 microns to 35 microns. Good total thickness variation TTV≤3 um can be achieved due to good bonding TTV. The thinning process may include back side grinding and back side etching. Block 406 may be followed by block 408.

Figure 5D:
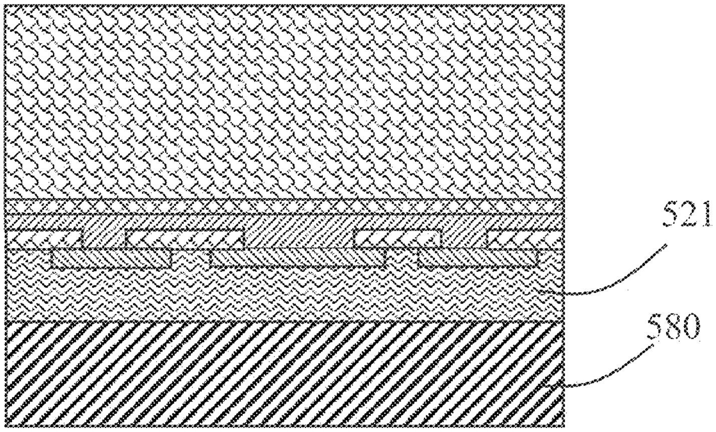

In block 408, referring now to FIG. 5D, a metal layer 580 is formed on a back surface of the thinned semiconductor substrate 521. In examples of the present disclosure, a thickness of each of the metal layer 580 is less than 10 microns. In one example, the metal layer 580 contain copper formed by electrochemical plating. In another example, the metal layer 580 contain silver or solder formed by electrochemical plating. In examples of the present, a cross section of the metal layer 580 is of a rectangular shape. Block 408 may be followed by block 410.

Figure 5E:
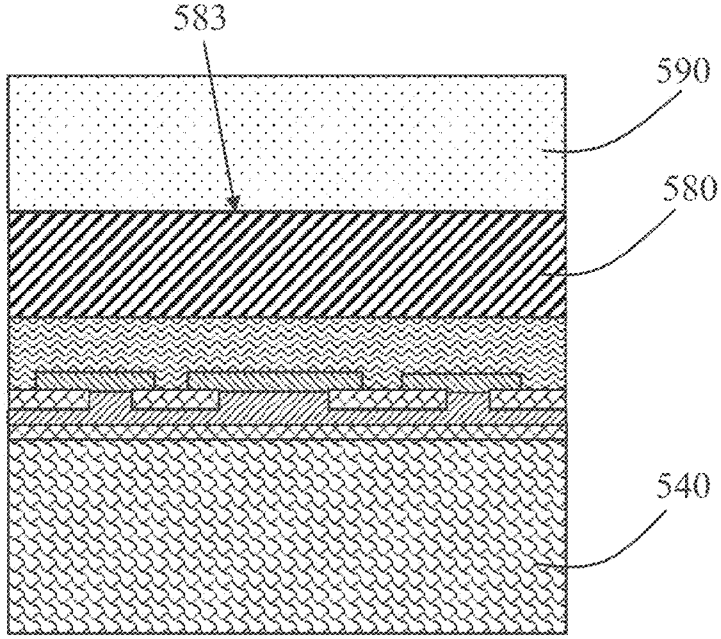

In block 410, referring now to FIG. 5E, the wafer is flipped so that the carrier 540 is at bottom. A molding encapsulation 590 is formed. The molding encapsulation 590 directly contacts a back surface 583 of the metal layer 585. The molding encapsulation 590 prevents the back surface 583 of the metal layer 585 from oxidation. In examples of the present disclosure, the CTE of the molding encapsulation 590 is less than 7 ppm/° C. and a Tg of the molding encapsulation 590 is larger than 150 degrees Centigrade. Block 410 may be followed by block 412.

Figure 5F:
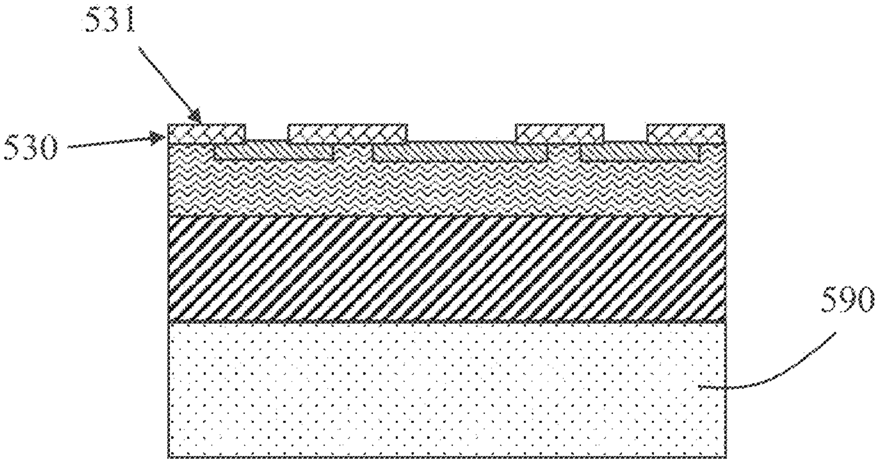

In block 412, referring now to FIG. 5F, the wafer is flipped again so that the molding encapsulation 590 is at bottom. The carrier 540 is removed so that top surfaces 531 of the plurality of contact pads 530 are exposed. In examples of the present disclosure, block 412 is a de-bonding process by applying a laser irradiation process. Block 412 may be followed by block 414.

Figure 5G:
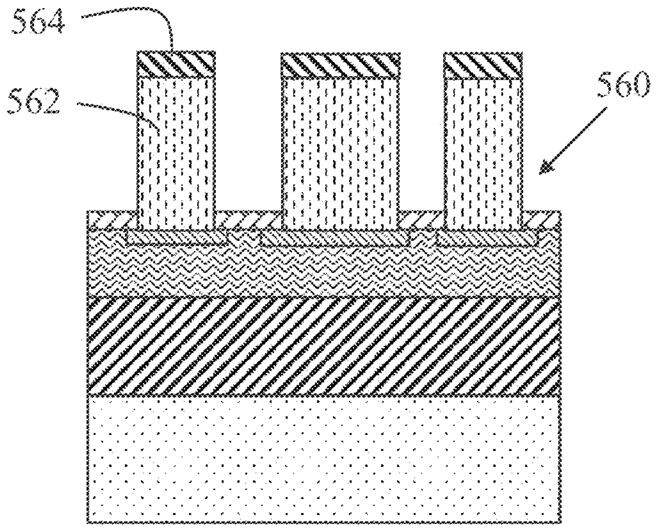

In block 414, referring now to FIG. 5G, a plurality of metal bumps 560 are formed on top of aluminum sections 532. In examples of the present disclosure, each of the plurality of metal bumps 560 is of a column shape. In examples of the present disclosure, each of the plurality of metal bumps 560 comprises a respective copper portion 562 between 20-100 um in height, and a respective tin-silver portion 564 between 15-30 um in height above the respective copper portion 562. Bottom surfaces of the plurality of metal bumps 560 and top surfaces of the plurality of aluminum sections 542 are co-planar. Block 414 may be followed by block 416.

Figure 5H:
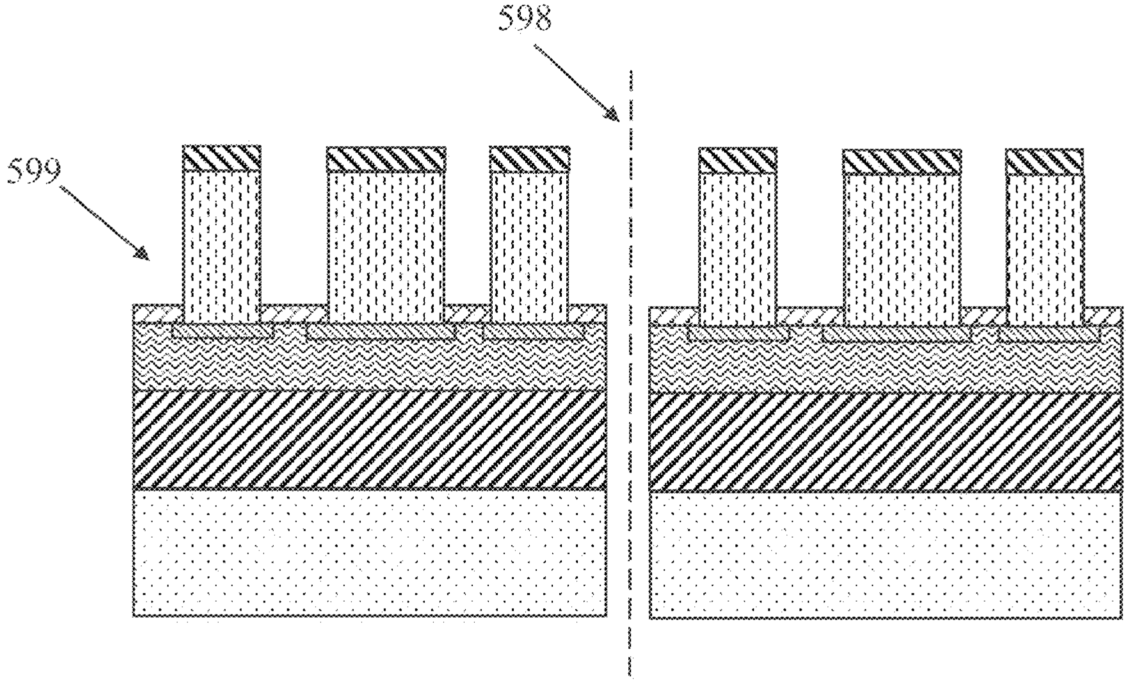

In block 416, referring now to FIG. 5H, a singulation process 598 is applied so as to form the plurality of semiconductor packages 599. Though two semiconductor packages are shown in the cross-sectional view of FIG. 5H, the number of semiconductor packages may vary. In one example, the singulation process is a laser cutting process. In another example, the singulation process is a saw blade cutting process.

In examples of the present disclosure, each of the plurality of semiconductor packages 599 is a common-drain metal-oxide-semiconductor field-effect transistor (MOSFET) chip scale package (CSP) for battery protection application. In examples of the present disclosure, two gates and a plurality of sources are on a front surface of the common-drain MOSFET CSP. A common-drain is on a back surface of the common-drain MOSFET CSP.

Those of ordinary skill in the art may recognize that modifications of the embodiments disclosed herein are possible. For example, a total number of the plurality of contact pads 330 may vary. Other modifications may occur to those of ordinary skill in this art, and all such modifications are deemed to fall within the purview of the present invention, as defined by the claims.

The invention claimed is:

1. A method for fabricating a plurality of semiconductor packages, the method comprising the steps of:
- providing a device wafer comprising
  - a semiconductor substrate having a front surface and a back surface opposite the front surface of the semiconductor substrate; and
  - a plurality of contact pads on the front surface of the semiconductor substrate;
- bonding the device wafer to a first carrier with the plurality of contact pads of the device wafer attached to the first carrier;
- applying a thinning process over the back surface of the semiconductor substrate so as to formed a thinned semiconductor substrate;
- forming a metal layer on a back surface of the thinned semiconductor substrate;
- applying a first tape to a back surface of the metal layer;
- removing the first carrier;
- applying a first singulation process forming a plurality of interim devices comprising a plurality of singulated semiconductor substrates and a plurality of singulated metal layers;
- transferring the plurality of interim devices onto a second carrier;
- forming a molding encapsulation overlaying back surfaces of the plurality of singulated metal layers;
- removing the second carrier;
- forming a plurality of metal bumps on the plurality of contact pads on the front surface of the semiconductor substrate; and
- attaching a second tape;
- applying a second singulation process forming the plurality of semiconductor packages;
- wherein a thickness of the thinned semiconductor substrate is in a range from 15 microns to 35 microns.

2. The method of claim 1, wherein a thickness of the metal layers on backside surface of thinned semiconductor substrate is at least 10 microns.

3. The method of claim 1, wherein each of the plurality of metal bumps is at least 35 um.

4. The method of claim 1, wherein each of the plurality of metal bumps comprises a respective copper portion, and a respective tin-silver portion above the respective copper portion.

5. The method of claim 1, wherein the plurality of contact pads comprises
- a plurality of aluminum sections; and
- a plurality of passivation sections above the plurality of aluminum sections;
- wherein bottom surfaces of the plurality of metal bumps and top surfaces of the plurality of aluminum sections are co-planar.

6. The method of claim 5, wherein the molding encapsulation further directly contacts side surfaces of the plurality of the singulated semiconductor substrates and side surfaces of the plurality of the singulated metal layers.

7. The method of claim 1, wherein total thickness variation (TTV) of the thinned semiconductor substrate is under 3 microns.

8. A method for fabricating a plurality of semiconductor packages, the method comprising the steps of:

providing a device wafer comprising a semiconductor substrate having a front surface and a back surface opposite the front surface of the semiconductor substrate; and a plurality of contact pads on the front surface of the semiconductor substrate;

bonding the device wafer to a carrier with the plurality of contact pads of the device wafer attached to the carrier;

applying a thinning process over the back surface of the semiconductor substrate so as to formed a thinned semiconductor substrate;

forming a metal layer on a back surface of the thinned semiconductor substrate;

forming a molding encapsulation directly contacting a back surfaces of the metal layer;

removing the carrier;

forming a plurality of metal bumps on the plurality of contact pads on the front surface of the semiconductor substrate; and applying a singulation process forming the plurality of semiconductor packages;

wherein a thickness of the thinned semiconductor substrate is in a range from 15 microns to 35 microns.

9. The method of claim 8, wherein a thickness of each of the plurality of metal bumps is at least 35 microns.

10. The method of claim 8, wherein each of the plurality of metal bumps is of a column shape.

11. The method of claim 8, wherein each of the plurality of metal bumps comprises a respective copper portion, and a respective tin-silver portion above the respective copper portion.

12. The method of claim 8, wherein the plurality of contact pads comprises a plurality of aluminum sections; and a plurality of passivation sections above the plurality of aluminum sections.

13. The method of claim 8, wherein total thickness variation (TTV) of the thinned semiconductor substrate is under 3 microns.

* * * * *